United States Patent
Chae et al.

(10) Patent No.: US 9,634,041 B2
(45) Date of Patent: Apr. 25, 2017

(54) DISPLAY APPARATUS AND METHOD OF MANUFACTURING THE SAME

(71) Applicant: Samsung Display Co., Ltd., Yongin, Gyeonggi-do (KR)

(72) Inventors: Seung-Yeon Chae, Yongin (KR); Sanggun Choi, Yongin (KR); Hansu Kim, Yongin (KR); Taewoon Cha, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 4 days.

(21) Appl. No.: 14/461,618

(22) Filed: Aug. 18, 2014

(65) Prior Publication Data
US 2015/0198829 A1    Jul. 16, 2015

(30) Foreign Application Priority Data

Jan. 14, 2014    (KR) ........................ 10-2014-0004700

(51) Int. Cl.
| | |
|---|---|
| *G02F 1/1339* | (2006.01) |
| *G02F 1/1333* | (2006.01) |
| *G02F 1/1335* | (2006.01) |
| *G02F 1/1368* | (2006.01) |
| *H01L 27/02* | (2006.01) |
| *H01L 27/12* | (2006.01) |
| *G02F 1/1362* | (2006.01) |

(52) U.S. Cl.
CPC .... *H01L 27/1259* (2013.01); *G02F 1/133377* (2013.01); *G02F 1/133512* (2013.01); *G02F 1/136209* (2013.01); *G02F 2001/136222* (2013.01)

(58) Field of Classification Search
CPC ......... G02F 1/133377; G02F 1/133512; G02F 1/136209; G02F 2001/136222
See application file for complete search history.

(56) References Cited

U.S. PATENT DOCUMENTS

| | | | |
|---|---|---|---|
| 6,469,761 B1 | 10/2002 | Drabik et al. | |
| 2010/0328565 A1* | 12/2010 | Kubota ............. | G02F 1/133707 349/43 |
| 2012/0062448 A1* | 3/2012 | Kim .................. | G02F 1/133377 345/55 |

FOREIGN PATENT DOCUMENTS

| | | |
|---|---|---|
| JP | 2010-237327 | 10/2010 |
| KR | 10-2003-0089204 | 11/2003 |

(Continued)

*Primary Examiner* — Nimeshkumar Patel
*Assistant Examiner* — Jacob R Stern
(74) *Attorney, Agent, or Firm* — Knobbe Martens Olson & Bear LLP

(57) ABSTRACT

A display apparatus includes a number of pixels. Each pixel includes a substrate including a pixel area and a non-pixel area disposed between adjacent pixel areas, a first electrode disposed on the substrate in the pixel area, and a second electrode extending in a first direction and being spaced apart upward from the substrate by a predetermined distance in the pixel area defining a tunnel-shaped cavity, an image display layer disposed in the tunnel-shaped cavity and driven by an electric field formed between the first electrode and the second electrode, a roof layer disposed on the second electrode, and a sealing layer extending in the first direction, having a black color, and being disposed in the non-pixel area between adjacent pixel areas in a second direction crossing the first direction to seal the tunnel-shaped cavity.

19 Claims, 22 Drawing Sheets

(56) References Cited

FOREIGN PATENT DOCUMENTS

| | | |
|---|---|---|
| KR | 10-2004-0052350 | 6/2004 |
| KR | 10-2005-0008284 | 1/2005 |
| KR | 10-2005-0112974 | 12/2005 |
| KR | 10-2005-0116032 | 12/2005 |
| KR | 10-2006-0046843 | 5/2006 |
| KR | 10-2006-0080760 | 7/2006 |
| KR | 10-2007-0006624 | 1/2007 |
| KR | 10-2007-0046461 | 5/2007 |
| KR | 10-2008-0034545 | 4/2008 |
| KR | 10-2009-0083197 | 8/2009 |
| KR | 10-2011-0044292 | 4/2011 |
| KR | 10-2011-0129103 | 12/2011 |
| KR | 10-2012-0026880 | 3/2012 |
| KR | 10-2013-0054014 | 5/2013 |

\* cited by examiner

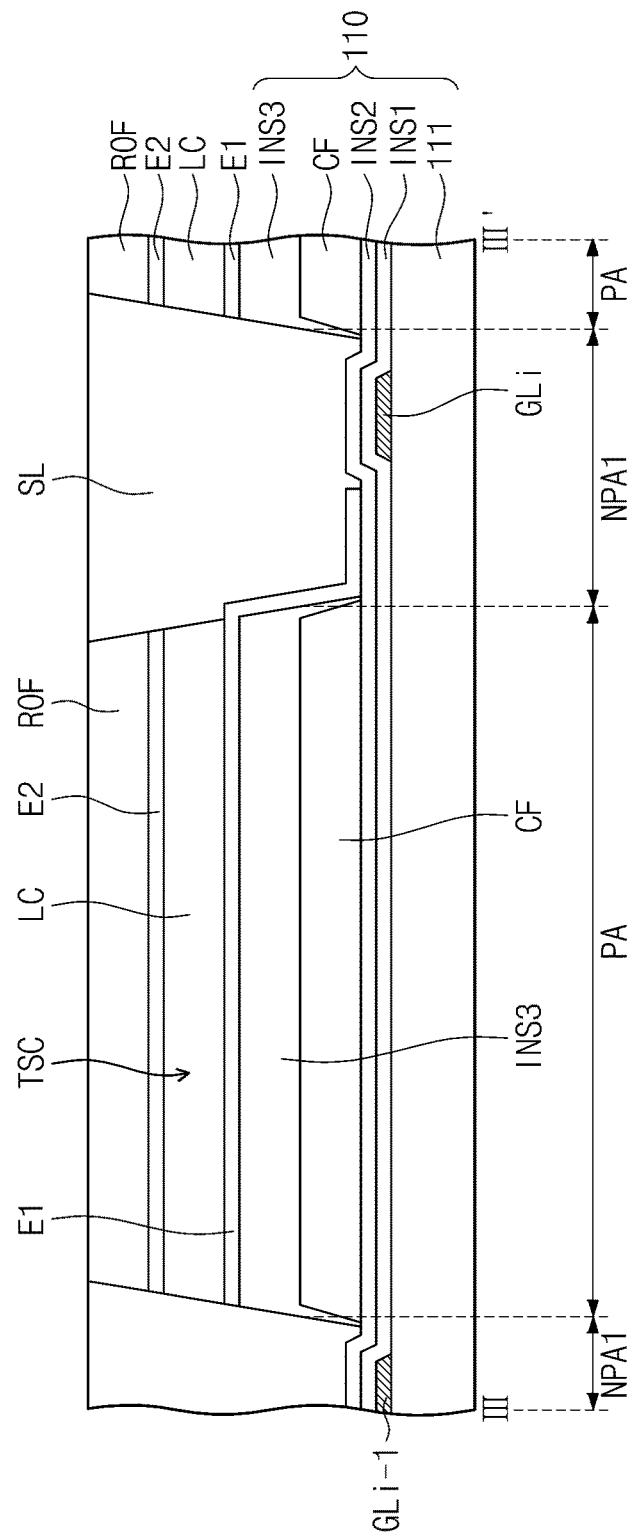

DISPLAY APPARATUS AND METHOD OF MANUFACTURING THE SAME

CROSS-REFERENCE TO RELATED APPLICATION

This application claims priority under 35 U.S.C. §119 of Korean Patent Application No. 10-2014-0004700, filed on Jan. 14, 2014, the contents of which are hereby incorporated by reference in their entirety.

BACKGROUND

Field

The present disclosure relates to a display apparatus and a method of manufacturing the display apparatus.

Description of the Related Technology

In recent years, various display devices, such as a liquid crystal display device, an organic light emitting display device, an electrowetting display device, an electrophoretic display device, and the like, have been developed.

In general, a display device includes pixels to display an image. The pixels receive data signals in response to gate signals, and display gray scales corresponding to the data signals.

The display device typically includes two substrates and an image display layer interposed between the two substrates. The image display layer may be a liquid crystal layer, an electrowetting layer, or an electrophoretic layer, for example. When the display device is manufactured, a spacer is formed on one of the two substrates to maintain a distance between the two substrates. The spacer is generally attached to the other of the two substrates using an adhesive. Due to the above-mentioned processes, a manufacturing process of the display device becomes complex and a manufacturing cost of the display device is increased.

SUMMARY OF CERTAIN INVENTIVE ASPECTS

The present disclosure provides a display apparatus capable of preventing occurrence of light leakage.

The present disclosure provides a manufacturing method of the display apparatus, which is able to improve reliability, reduce a manufacturing cost, and simplify a manufacturing process.

Embodiments of the inventive concept provide a display apparatus including a plurality of pixels. Each pixel includes a substrate including a pixel area and a non-pixel area disposed between adjacent pixel areas, a first electrode disposed on the substrate in the pixel area, a second electrode extending in a first direction and being spaced apart upward from the substrate by a predetermined distance in the pixel area such that a tunnel-shaped cavity is defined between the second electrode and the substrate, an image display layer disposed in the tunnel-shaped cavity and driven by an electric field formed between the first electrode and the second electrode, a roof layer disposed on the second electrode, and a sealing layer extending in the first direction, having a black color, and being disposed in the non-pixel area between adjacent pixel areas in a second direction crossing the first direction to seal the tunnel-shaped cavity.

Each non-pixel area includes a first non-pixel area disposed between adjacent pixel areas in the second direction and extending in the first direction and a second non-pixel area disposed between adjacent pixel areas in the first direction.

The second electrode is disposed adjacent to the substrate in the second non-pixel area and spaced apart upward from the substrate in the pixel areas to define the tunnel-shaped cavity.

The substrate includes a base substrate, a color filter disposed on the base substrate in the pixel area, a black matrix disposed on the base substrate in the second non-pixel area, and an organic insulating layer disposed on the color filter and the black matrix.

The sealing layer is disposed on the base substrate in the first non-pixel area and has a same height as the roof layer.

The black matrix includes a photoresist resin and at least one of a chromium-containing metal material having a black color or a carbon-containing organic material having a black color.

The sealing layer comprises at least one of an acryl resin, a ultra-violet curing agent, a photo initiator, a coupling agent, or carbon-containing particles having a black color.

The roof layer is configured to planarize an upper portion of the second electrode.

The substrate further includes a thin film transistor connected to the first electrode and the thin film transistor is disposed in the first non-pixel area.

The image display layer comprises a liquid crystal layer.

Embodiments of the inventive concept provide a method of manufacturing a display apparatus, including forming a plurality of pixels. Forming the plurality of pixels includes: preparing a substrate including a pixel area and a non-pixel area disposed between the pixel areas, forming a first electrode on the substrate in the pixel area, forming a sacrificial layer on the substrate, the sacrificial layer extending in a second direction crossing the first direction and being overlapped with the pixel areas arranged in the second direction, forming a second electrode on the substrate, the second electrode extending in the first direction and covering the sacrificial layer in the pixel area, forming a roof layer on the second electrode, wet-etching the sacrificial layer to form a tunnel-shaped cavity between the second electrode and the substrate in the pixel area, forming a liquid crystal layer in the tunnel-shaped cavity, and forming a sealing layer extending in the first direction and being disposed in the non-pixel area between the pixel areas in the second direction to seal the tunnel-shaped cavity, the sealing layer having a black color.

According to the above, the display apparatus prevents occurrence of light leakage. In addition, the reliability of the display apparatus is improved, the manufacturing cost of the display apparatus is reduced, and the manufacturing process of the display apparatus is simplified.

BRIEF DESCRIPTION OF THE DRAWINGS

The above and other advantages of the present disclosure will become readily apparent by reference to the following detailed description when considered in conjunction with the accompanying drawings wherein:

FIG. 6 is a cross-sectional view taken along a line II-III' shown in FIG. 3;

DETAILED DESCRIPTION OF CERTAIN INVENTIVE EMBODIMENTS

Figure 1:
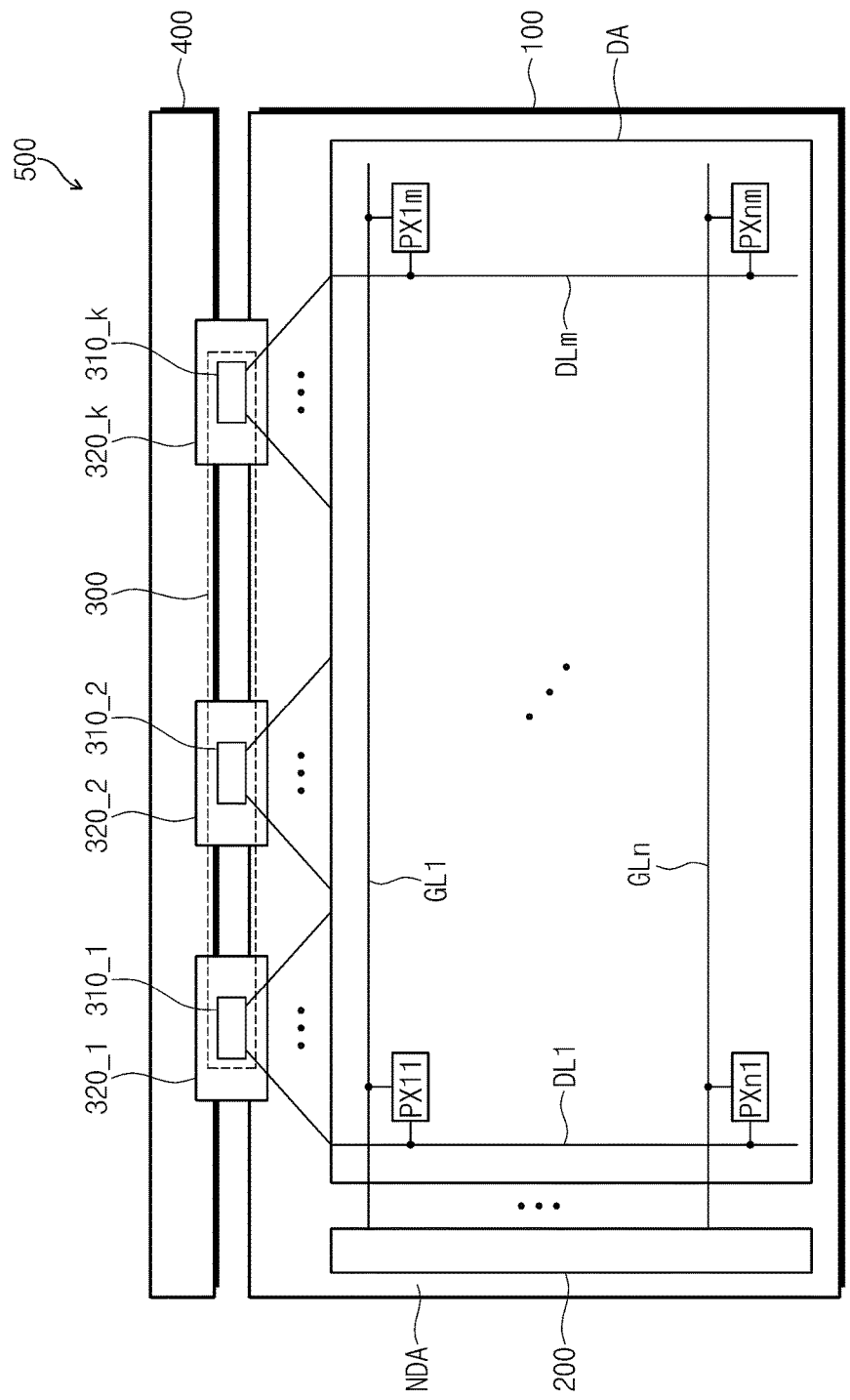
FIG. 1 is a plan view showing a display apparatus according to an embodiment of the present disclosure.

It will be understood that when an element or layer is referred to as being "on", "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (for example rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

FIG. 1 is a plan view showing a display apparatus according to an embodiment of the present disclosure.

Referring to FIG. 1, a display apparatus 500 includes a display panel 100, a gate driver 200, a data driver 300, and a driving circuit board 400.

The display panel 100 includes a plurality of pixels PX11 to PXnm, a plurality of gate lines GL1 to GLn, and a plurality of data lines DL1 to DLm. Each of "m" and "n" is an integer number greater than zero (0). The display panel 100 includes a display area DA and a non-display area NDA surrounding the display area DA when viewed in a plan view.

The pixels PX11 to PXnm are disposed in the display area DA and arranged in a matrix form. The data lines DL1 to DLm are insulated from the gate lines GL1 to GLn while crossing the gate lines GL1 to GLn, and connected to the pixels PX11 and PXnm.

The gate lines GL1 to GLn extend in a row direction and are connected to the gate driver 200. The gate lines GL1 to GLn receive gate signals sequentially provided from the gate driver 200.

The data lines DL1 to DLm extend in a column direction and are connected to the data driver 300. The data lines DL1 to DLm receive data voltages from the data driver 300 in analog form.

Each of the pixels PX11 to PXnm is connected to a corresponding gate line of the gate lines GL1 to GLn and a corresponding data line of the data lines DL1 to DLm. The pixels PX11 to PXnm receive the data voltages through the corresponding data lines DL1 to DLm in response to the gate signals provided through the corresponding gate lines GL1 to GLn. The pixels PX11 to PXnm display gray scales corresponding to the data voltages.

The gate driver 200 is disposed in the non-display area NDA disposed adjacent to one side of the display area DA. The gate driver 200 is disposed in the non-display area NDA adjacent to a left side of the display area DA in an amorphous silicon TFT gate driver circuit (ASG) form.

The gate driver 200 generates the gate signals in response to a gate control signal applied from a timing controller (not shown), which is mounted on the driving circuit board 400. The gate signals are sequentially applied to the pixels PX11 to PXnm through the gate lines GL1 to GLn in the unit of row. Thus, the pixels PX11 to PXnm are driven in the unit of row.

The data driver 300 receives image signals and a data control signal from the timing controller. The data driver 300 generates the data voltages in analog form, which correspond to the image signals, in response to the data control signal. The data driver 300 applies the data voltages to the pixels PX11 to PXnm through the data lines DL1 to DLm.

The data driver 300 includes a plurality of source driving chips 310_1 to 310_k. "k" is an integer number greater than 0 and smaller than "m". Each of the source driving chips 310_1 to 310_k is mounted on a corresponding source flexible circuit board of source flexible circuit boards 320_1 to 320_k and connected between the driving circuit board 400 and the non-display area NDA.

In one embodiment, the source driving chips 310_1 to 310_k are mounted on the flexible circuit boards 320_1 to 320_k in a tape carrier package (TCP) manner. However, it should not be limited thereto or thereby. The source driving chips 310_1 to 310_k may alternatively be mounted on the non-display area NDA in a chip on glass (COG) manner.

Figure 2:
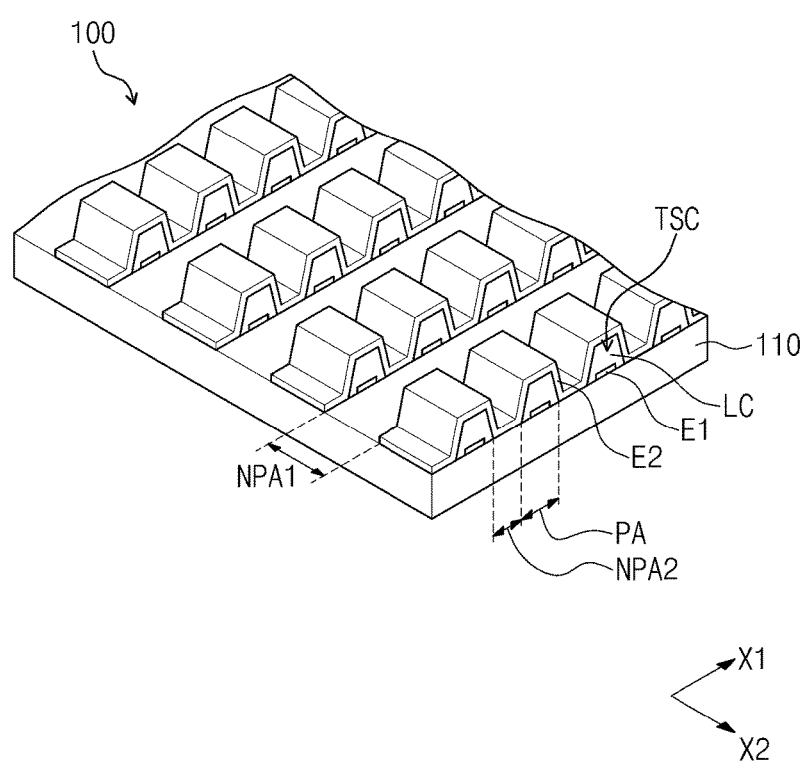
FIG. 2 is a perspective view showing a portion of a display area of a display panel shown in FIG. 1.

FIG. 2 is a perspective view showing a portion of a display area of a display panel shown in FIG. 1.

Referring to FIG. 2, the display panel 100 includes a substrate 110, a plurality of first electrodes E1, and a plurality of second electrodes E2, which are disposed on the substrate 110. The substrate 110 includes a plurality of pixel areas PA corresponding to the pixels PX11 to PXnm and non-pixel areas NPA1 and NPA2 disposed between the pixel areas PA.

The pixel areas PA are arranged in a matrix form as the pixels PX11 to PXnm, and the non-pixel areas NPA1 and NPA2 correspond to boundary areas between the pixel areas PA.

Hereinafter, the row direction is referred to as a first direction X1 and the column direction crossing the row direction is referred to as a second direction X2.

The non-pixel areas NPA1 and NPA2 include a first non-pixel area NPA1 and a second non-pixel area NPA2. The first non-pixel area NPA1 is disposed between the pixel areas PA in the second direction X2 and extends in the first direction X1.

The second non-pixel area NPA2 is disposed between the pixel areas PA in the first direction X1. The second non-pixel area NPA2 is disposed between the pixel areas PA in the first direction X1 without extending in the second direction X2.

The first electrodes E1 are arranged in the pixel areas PA of the substrate 110 to correspond to the pixels PX11 to PXnm, respectively. The first electrodes E1 may be pixel electrodes. The first electrodes E1 receive the data voltages through switching devices (hereinafter, referred to as thin film transistors) formed on the substrate 110. This is described with reference to FIGS. 3 to 6 below.

The second electrodes E2 are disposed on the substrate 110. The second electrodes E2 are spaced apart from each other at regular intervals in the second direction X2 and extend in the first direction X1. The second electrodes E2 may be common electrodes. The second electrodes E2 are commonly connected to a common voltage line (not shown) disposed in the non-display area NDA. The second electrodes E2 receive a common voltage through the common voltage line.

The second electrodes E2 are disposed to overlap with the pixel areas PA arranged in the first direction X1. The second electrodes E2 are disposed adjacent to the substrate 110 in the second non-pixel area NPA2 and are spaced apart upward from the substrate 110 in the pixel areas PA to define tunnel-shaped cavities TSC. The tunnel-shaped cavities TSC are formed between the second electrodes E2 and the substrate 110 in the pixel areas PA.

An image display layer LC is disposed in each of the tunnel-shaped cavities TSC. The image display layer LC is driven by an electric field formed between the first electrodes E1 and the second electrodes E2 to display an image. The image display layer LC may be a liquid crystal layer LC, but it should not be limited to the liquid crystal layer LC. The image display layer LC may alternatively be an electrophoretic layer or an electrowetting layer. Hereinafter, the liquid crystal layer LC will be described as the image display layer LC.

The tunnel-shaped cavity TSC extends in the second direction X2 and both ends of the tunnel-shaped cavity TSC are open. Although not shown in figures, a roof layer is disposed on the substrate 110 and extends in the first direction X1 to cover an upper surface of the second electrodes E2.

Although not shown in figures, a sealing layer is disposed on the substrate 110 in the first non-pixel area NPA1. The sealing layer covers the substrate 110 to seal both ends of the tunnel-shaped cavities TSC. The roof layer and the sealing layer are described with reference to FIGS. 4 to 6 below.

Figure 3:
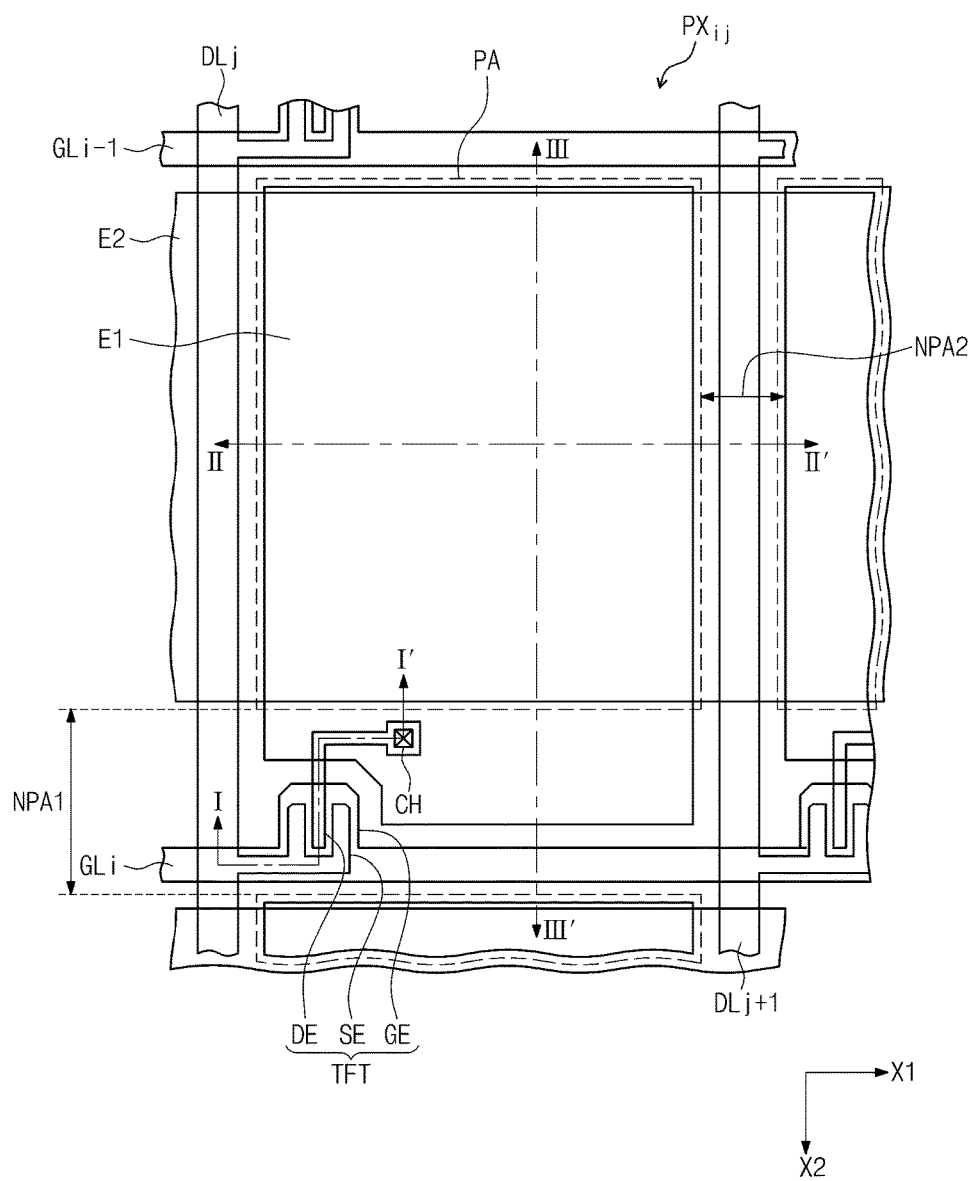
FIG. 3 is a layout diagram showing a pixel shown in FIG. 1.

FIG. 3 is a layout diagram showing a pixel shown in FIG. 1.

FIG. 3 shows only one pixel PXij, but other pixels have the same structure as that of the pixel PXij. Accordingly, hereinafter, the structure of the pixel PXij will be described in detail.

Referring to FIG. 3, the pixel PXij includes the thin film transistor TFT connected to the corresponding gate line GLi and the corresponding data line DLj, the first electrode E1 connected to the thin film transistor TFT, the second electrode E2 defining the tunnel-shaped cavity TSC, and the liquid crystal layer LC disposed in the tunnel-shaped cavity TSC. "i" is an integer number larger than zero (0) and equal to or smaller than "n". "j" is an integer number larger than zero (0) and equal to or smaller than "m".

The second electrode E2 defining the tunnel-shaped cavity TSC and the liquid crystal layer LC disposed in the tunnel-shaped cavity TSC are described with reference to FIGS. 4 to 6 below.

The pixel PXij includes the pixel area PA and the first and second non-pixel areas NPA1 and NPA2 disposed between the pixels areas PA. The image is displayed in the pixel area PA and is not displayed in the non-pixel areas since the light traveling to the non-pixel areas is blocked.

As described above, the first non-display area NPA1 is disposed between the pixel areas PA in the second direction X2 and extends in the first direction X1. In addition, the second non-display area NPA2 is disposed between the pixel areas PA in the first direction X1.

The gate lines GLi−1 and GLi and the thin film transistor TFT are disposed in the first non-pixel area NPA1. The data lines DLj and DLj+1 are disposed in the second non-pixel area NPA2 and extend in the second direction X2 to cross the gate lines GLi−1 and GLi.

The thin film transistor TFT includes a gate electrode GE branched from the gate line GLi, a source electrode SE branched from the data line DLj, and a drain electrode DE connected to the first electrode E1. The drain electrode DE is electrically connected to the first electrode E1 through a contact hole CH.

The first electrode E1 is disposed in the pixel area PA to overlap with the second electrode E2. In addition, the first electrode E1 extends in the second direction X2 in the pixel area PA and is connected to the drain electrode DE of the thin film transistor TFT.

The first electrode E1 includes a transparent conductive material, such as, for example, indium tin oxide (ITO), indium zinc oxide (IZO), indium tin zinc oxide (ITZO), or the like.

The second electrode E2 extends in the first direction X1 to overlap with the pixel area PA and the second non-pixel area NPA2. The second electrode E2 includes a transparent conductive material, such as, for example, indium tin oxide (ITO), indium zinc oxide (IZO), indium tin zinc oxide (ITZO), or the like.

Figure 4:
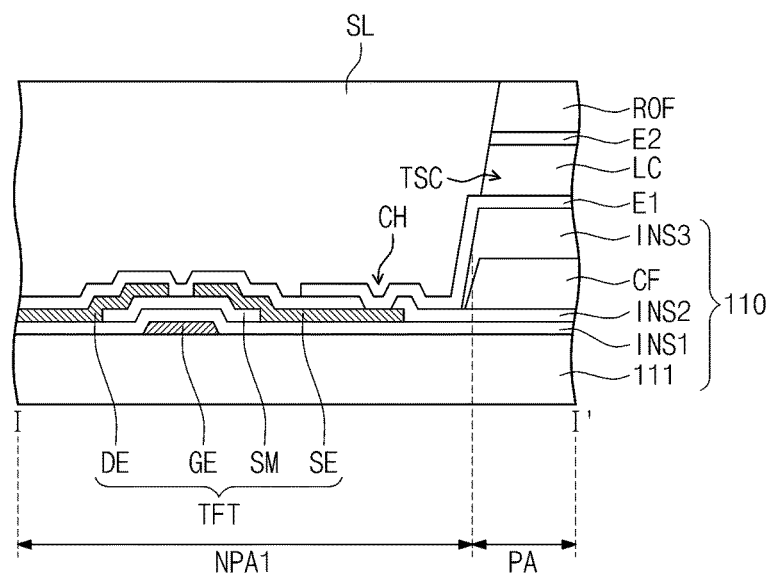
FIG. 4 is a cross-sectional view taken along a line I-I' shown in FIG. 3.
Figure 5:
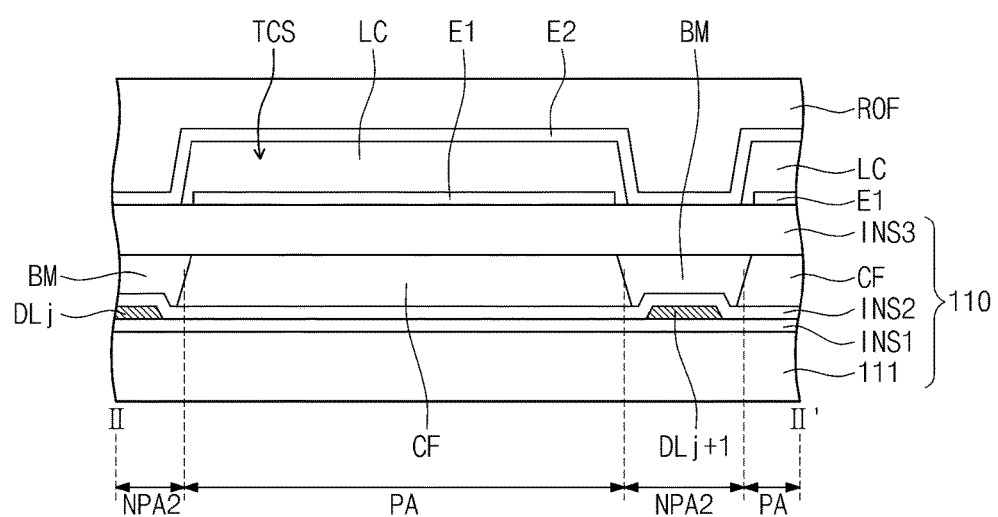
FIG. 5 is a cross-sectional view taken along a line II-II' shown in FIG. 3.

FIG. 4 is a cross-sectional view taken along a line I-I' shown in FIG. 3, FIG. 5 is a cross-sectional view taken along a line II-II' shown in FIG. 3, and FIG. 6 is a cross-sectional view taken along a line III-III' shown in FIG. 3.

Referring to FIGS. 4, 5, and 6, the substrate 110 includes a base substrate 111, the thin film transistor TFT, a color filter CF, a black matrix BM, and first to third insulating layers INS1 to INS3, which are disposed on the base substrate 111. The first electrode E1, the second electrode E2, the liquid crystal layer LC, the roof layer ROF, and the sealing layer SL are disposed on the substrate 110.

The first insulating layer INS1 is disposed on the base substrate 111 to cover the gate lines GLi−1 and GLi. The base substrate 111 may be a transparent or non-transparent insulating substrate. For example, the base substrate 111 may be a silicon substrate, a glass substrate, or a plastic substrate.

The first insulating layer INS1 may be a gate insulating layer. The first insulating layer INS1 may be an inorganic insulating layer including an inorganic material. For example, the first insulating layer INS1 may include an insulating material, such as, for example, silicon nitride, silicon oxide, or the like. The data lines DLj and DLj+1 extend to cross the gate lines GLi−1 and GLi and are disposed on the first insulating layer INS1.

As shown in FIG. 4, the thin film transistor TFT is disposed on the base substrate 111. The thin film transistor TFT includes the gate electrode GE, a semiconductor layer SM, the source electrode SE, and the drain electrode DE.

The gate electrode GE is branched from the gate line GLi. The first insulating layer INS1 is disposed on the base substrate 111 to cover the gate electrode GE. The semiconductor layer SM of the thin film transistor TFT is disposed on the first insulating layer INS1 that covers the gate electrode GE. Although not shown in figures, the semiconductor layer SM includes an active layer and an ohmic contact layer.

The source electrode SE and the drain electrode DE of the thin film transistor TFT are disposed on the semiconductor layer SM and the first insulating layer INS1, and spaced apart from each other. The semiconductor layer SM forms a conductive channel between the source electrode SE and the drain electrode DE.

The second insulating layer INS2 is disposed on the first insulating layer INS1 to cover the thin film transistor TFT. In addition, the second insulating layer INS2 is disposed on the first insulating layer INS1 to cover the data lines DLj and DLj+1. The second insulating layer INS2 may serve as a passivation layer. The second insulating layer INS2 covers the exposed upper surface of the semiconductor layer SM.

The contact hole CH is formed through the second insulating layer INS2 to expose a portion of the drain electrode DE. The first electrode E1 is electrically connected to the drain electrode DE of the thin film transistor TFT through the contact hole CH.

As shown in FIGS. 5 and 6, the color filter CF is disposed on the second insulating layer INS2 in the pixel area PA. The black matrix BM is disposed on the second insulating layer INS2 in the second non-pixel area NPA2. The color filter CF and the black matrix BM may be overlapped with each other in the boundary between the pixel area PA and the second non-pixel area NPA2.

The color filter CF assigns a color to the light transmitting through the pixel. The color filter CF may be a red color filter, a green color filter, or a blue color filter, and is disposed to correspond to the pixel area PA. Color filters CF having different colors are disposed in the pixel areas PA such that the pixels adjacent to each other display different colors among the pixels PX11 to PXnm shown in FIG. 1.

The black matrix BM blocks unnecessary light in the second non-pixel area NPA2. For example, the black matrix BM prevents light leakage caused by malfunction of the liquid crystal molecules in edges of the pixel area PA adjacent to the second non-pixel area NPA2. In addition, the black matrix BM prevents colors from mixing in edges of the color filter CF adjacent to the second non-pixel area NPA2.

The third insulating layer INS3 is disposed on the color filter CF and the black matrix BM in the pixel area PA and the second non-pixel area NPA2. The third insulating layer INS3 may serve as a planarization layer to planarize upper portions of the color filter CF and the black matrix BM. An upper surface of the third insulating layer INS3 is planarized. The third insulating layer INS3 may be an organic insulating layer including an organic material.

The third insulating layer INS3 is disposed to cover the color filter CF. A side surface of the third insulating layer INS3 may be disposed at the boundary between the pixel area PA and the first non-pixel area NPA1.

The first electrode E1 is disposed on the third insulating layer INS3 in the pixel area PA. The first electrode E1 extends to the first non-pixel area NPA1 to overlap with the drain electrode DE of the thin film transistor TFT. The first electrode E1 is electrically connected to the drain electrode DE through the contact hole CH formed through the second insulating layer INS2.

The second electrode E2 is disposed on the third insulating layer INS3 and extends in the first direction X1. The second electrode E2 is disposed to overlap with the pixel areas PA and the second non-pixel area NPA2, which are arranged in the first direction X1. In addition, the second electrode E2 is disposed to overlap with the first electrode E1 in the pixel areas PA.

The second electrode E2 makes contact with the third insulating layer INS3 in the second non-pixel area NPA2 and is spaced apart upward from the third insulating layer INS3 in the pixel area PA to form the tunnel-shaped cavity TSC. The liquid crystal layer LC is disposed in the tunnel-shaped cavity TSC. Although not shown in figures, a fourth insulating layer may be disposed on the third insulating layer INS3 to cover the first electrode E1.

The roof layer ROF is disposed on the second electrode E2 and extends in the first direction X1. The roof layer ROF extends in the first direction X1, in which the second electrode E2 extends, and covers the upper surface of the second electrode E2. The roof layer ROF planarizes the upper portion of the second electrode E2. The upper surface of the roof layer ROF is planarized.

The tunnel-shaped cavity TSC extends in the second direction X2 and both ends of the tunnel-shaped cavity TSC in the second direction X2 are open. Since the roof layer ROF is not disposed at the ends in upper and lower directions of the tunnel-shaped cavity TSC, both ends of the tunnel-shaped cavity TSC are open. Therefore, both ends of the tunnel-shaped cavity TSC are disposed adjacent to the first non-pixel area NPA1.

Although not shown in figures, an inorganic insulating layer may be further disposed between the second electrode E2 and the roof layer ROF. The inorganic insulating layer may include an inorganic material, such as, for example, silicon nitride or silicon oxide. The inorganic insulating layer supports the roof layer ROF such that the tunnel-shaped cavity TSC is stably maintained by the roof layer ROF.

The sealing layer SL is disposed on the second insulating layer INS2 in the first non-pixel area NPA1. The sealing layer SL is disposed to the height of the roof layer ROF. Accordingly, the sealing layer SL disposed in the first non-pixel area NPA1 blocks both ends of the tunnel-shaped cavity TSC to seal the tunnel-shaped cavity TSC.

The sealing layer SL has a black color SL. The sealing layer SL includes a material different from that of the black matrix BM. For example, the black matrix BM may be formed by mixing a photoresist resin with a chromium-containing metal material having a black color, or a carbon-containing organic material having a black color. The sealing layer SL may be formed by mixing an ultraviolet curable resin, such as for example acrylate, with the carbon-containing organic material.

The sealing layer SL may include an acryl resin, a ultra-violet curing agent, a photo initiator, a coupling agent, or carbon-containing particles having the black color.

The sealing layer SL having a black color prevents light leakage caused by malfunction of the liquid crystal molecules in edges of the pixel area PA adjacent to the first non-pixel area NPA1. In addition, the sealing layer SL having a black color prevents colors from mixing in edges of the color filter CF adjacent to the first non-pixel area NPA1.

The thin film transistor TFT is turned on in response to the gate signal provided through the gate line GLi. The data voltage provided through the data line DLj is applied to the first electrode E1 through the turned-on thin film transistor TFT. The second electrode E2 is applied with the common voltage.

Due to the difference in level between the data voltage and the common voltage, an electric field is formed between the first electrode E1 and the second electrode E2. The liquid crystal molecules of the liquid crystal layer LC are driven by the electric field formed between the first electrode E1 and the second electrode E2. As a result, a variation in amount of the light passing through the liquid crystal layer LC occurs, and thus a desired image is displayed. Although not shown in figures, a backlight unit may be disposed at a rear side of the display panel 100 to provide light to the display panel 100.

The third insulating layer INS3 may be disposed in the first non-pixel area NPA1 to have the same height as that of the third insulating layer INS3 disposed in the second non-pixel area NPA2. The black matrix having a height smaller than that of the tunnel-shaped cavity TSC is disposed on the third insulating layer INS3 in the first non-pixel area NPA1. The black matrix includes the same material as that of the black matrix BM disposed in the second non-pixel area NPA2. The black matrix disposed in the second non-pixel area NPA2 is referred to as a first black matrix and the black matrix on the third insulating layer INS3 in the first non-pixel area NPA1 is referred to as a second black matrix.

The sealing layer having light transmittance is disposed on the roof layer ROF and the second black matrix. The sealing layer having the light transmittance covers the roof layer ROF and the second black matrix and seals both ends of the tunnel-shaped cavity TSC. Light leakage may occur in the first non-pixel area NPA1 by the sealing layer having light transmittance and being disposed on the second black matrix.

According to embodiments of the display apparatus 500, however, the sealing layer SL having a black color is disposed in the first non-pixel area NPA1 and has the same height as the roof layer ROF, so that both ends of the tunnel-shaped cavity TSC are sealed by the sealing layer SL. Therefore, light leakage may be effectively prevented when the sealing layer SL is disposed in the first non-pixel area NPA1 and has the same height as the roof layer ROF compared to when the second black matrix is disposed lower than the tunnel-shaped cavity TSC.

Consequently, embodiments of the display apparatus 500 may prevent the occurrence of light leakage.

FIGS. 7 to 14 are views showing an embodiment of a manufacturing method of the display apparatus a. For the convenience of explanation, an embodiment of the manufacturing method of the display apparatus 500 will be described using cross-sectional views corresponding to the lines I-I', II-II', and III-III' shown in FIG. 3.

Figure 7A:
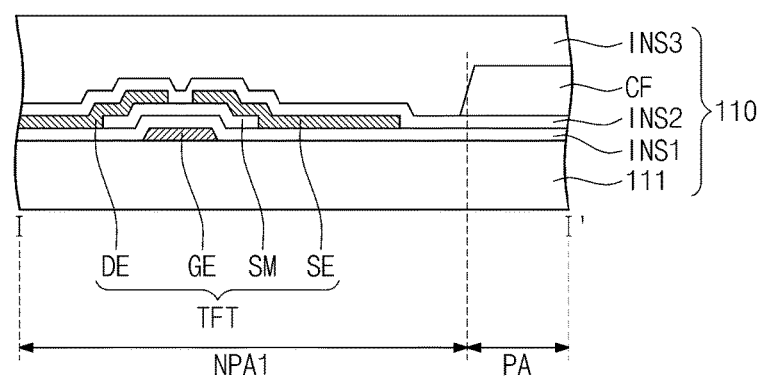
FIGS. 7A, 7B, and 7C are cross-sectional views showing a thin film transistor, a color filter, a black matrix, and a third insulating layer, which are disposed on a base substrate.
Figure 7B:
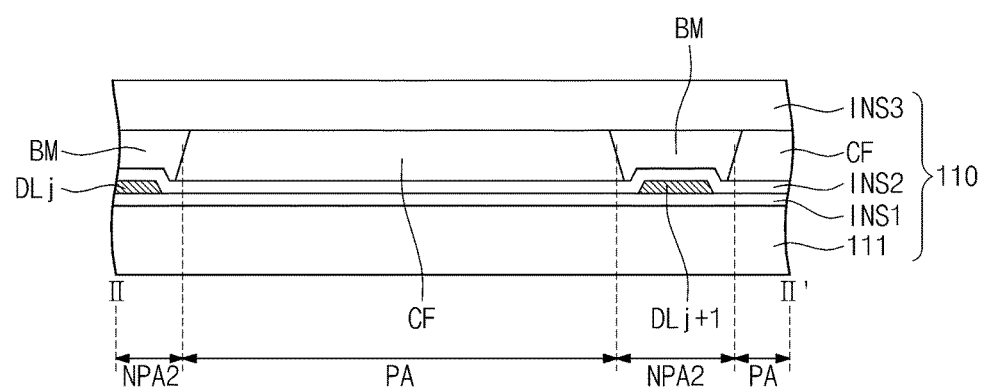
Figure 7C:
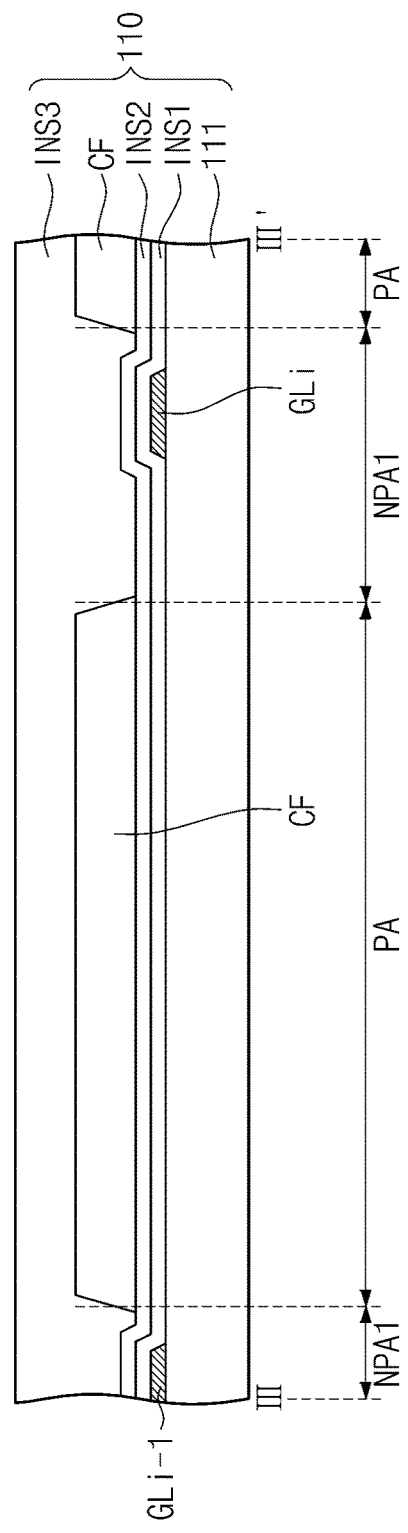

FIGS. 7A, 7B, and 7C are cross-sectional views showing the thin film transistor, the color filter, the black matrix, and the third insulating layer, which are disposed on the base substrate.

Referring to FIGS. 7A, 7B, and 7C, the thin film transistor TFT, the color filter CF, the black matrix BM, and the third insulating layer INS3 are formed on the base substrate 111.

The thin film transistor TFT is formed on the base substrate 111 and the second insulating layer INS2 is formed on the base substrate 111 to cover the thin film transistor TFT.

The color filter CF is formed on the second insulating layer INS2 in the pixel area PA. The black matrix BM is formed on the second insulating layer INS2 in the second non-pixel area NPA2.

The third insulating layer INS3 is formed on the color filter CF and the black matrix BM. The third insulating layer INS3 is formed on the second insulating layer INS2 to cover the color filter CF and the black matrix BM.

Figure 8A:
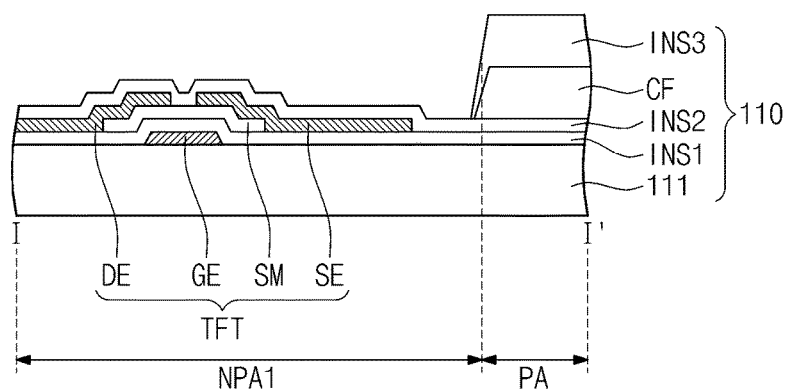
FIGS. 8A, 8B, and 8C are cross-sectional views a first non-pixel area from which the third insulating layer is removed.
Figure 8B:
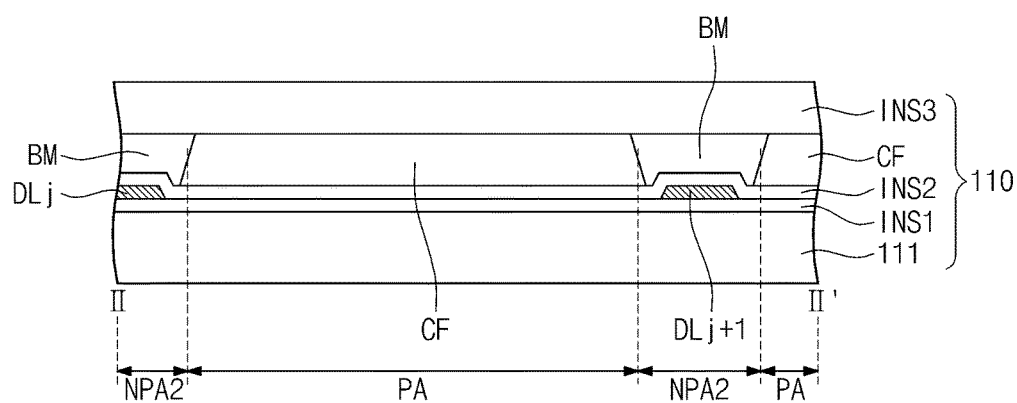
Figure 8C:
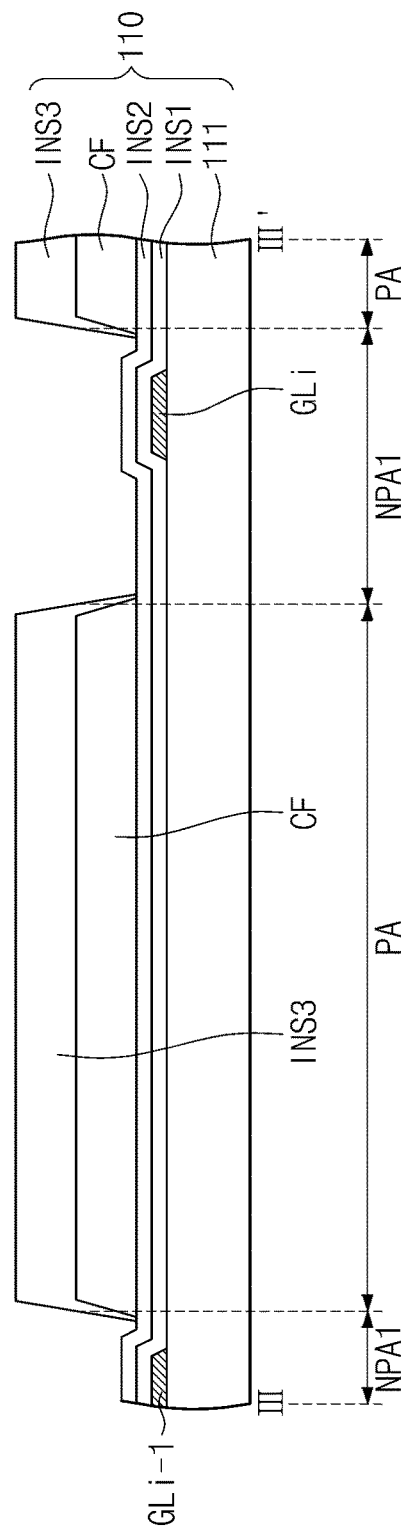

FIGS. 8A, 8B, and 8C are cross-sectional views the first non-pixel area from which the third insulating layer is removed.

Referring to FIGS. 8A, 8B, and 8C, the third insulating layer INS3 formed on the base substrate 111 is removed from the first non-pixel area NPA1. The third insulating layer INS3 formed in the first non-pixel area NPA1 is formed by using a photoresist process.

For example, the third insulating layer INS3 formed in the first non-pixel area NPA1 is exposed to light using a photo-mask through which an area thereof corresponding to the first non-pixel area NPA1 is opened, and the exposed portion of the third insulating layer INS3 is developed, thereby removing the third insulating layer INS3 formed in the first non-pixel area NPA1.

After the third insulating layer INS3 is removed from the first non-pixel area NPA1, the third insulating layer INS3 covers the color filter CF. In addition, the side surface of the third insulating layer INS3 is disposed at the boundary between the pixel area PA and the first non-pixel area NPA1.

FIGS. 9A, 9B, 9C, and 9D are views showing a sacrificial layer disposed on the substrate.

Figure 9A:
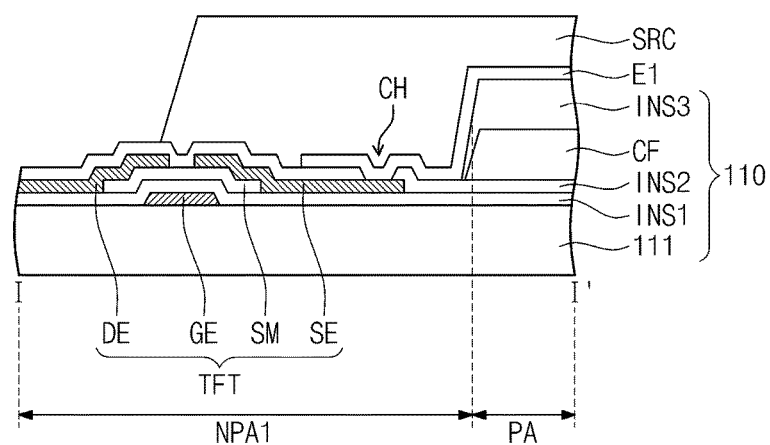
FIGS. 9A, 9B, 9C, and 9D are views showing a sacrificial layer disposed on a substrate.
Figure 9B:
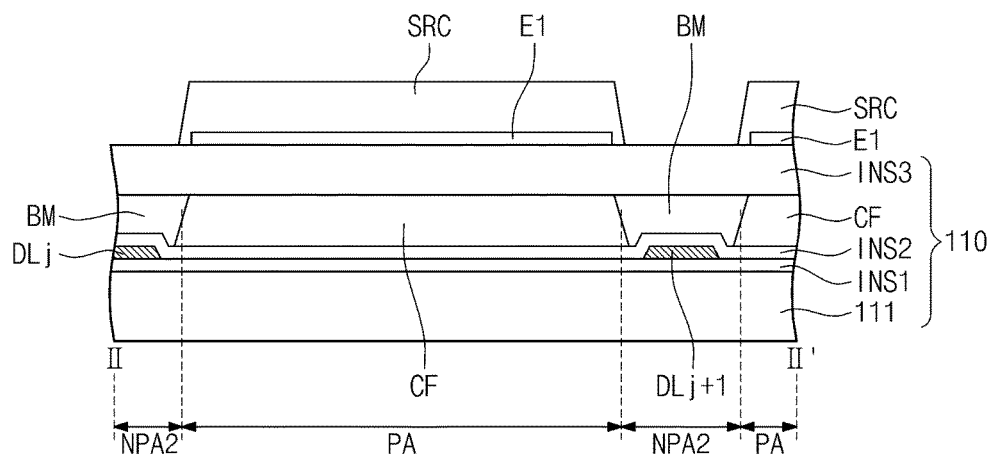
Figure 9C:
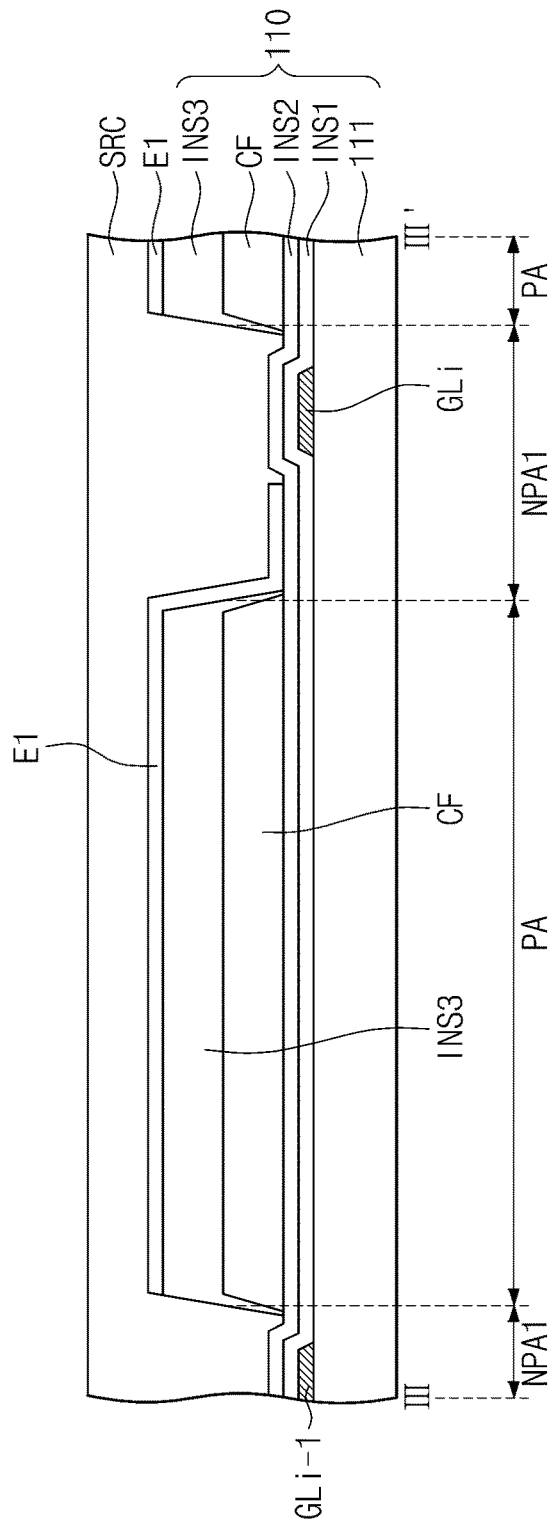
Figure 9D:
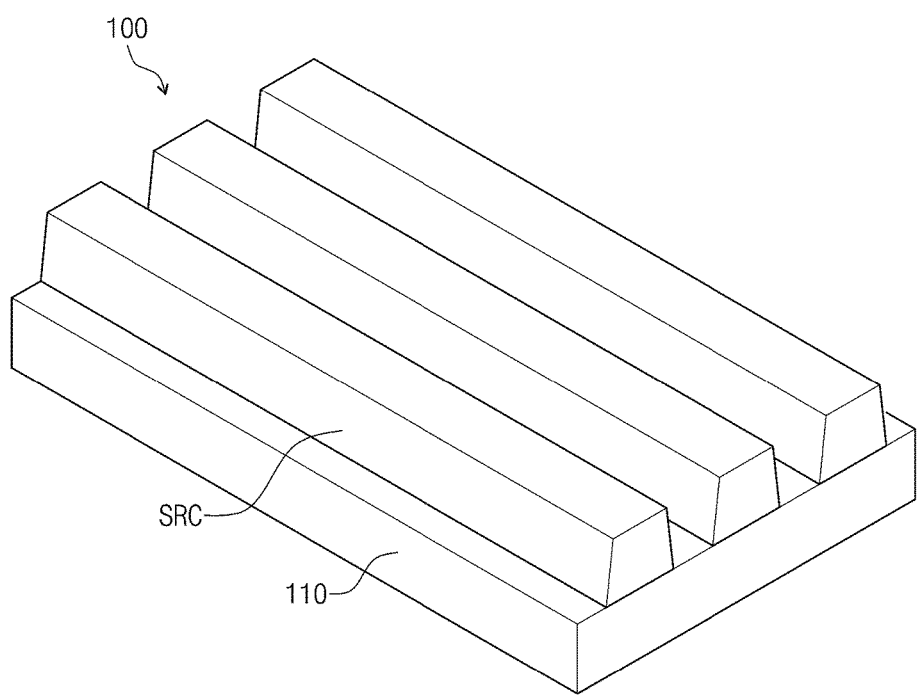

For the convenience of explanation, FIG. 9D shows only the substrate 110 and the sacrificial layer formed on the substrate 110.

Referring to FIGS. 9A, 9B, 9C, and 9D, the first electrode E1 is formed on the third insulating layer INS3 in the pixel area PA. The first electrode E1 extends to the first non-pixel area NPA1 to overlap with the drain electrode DE of the thin film transistor TFT. The first electrode E1 is electrically connected to the drain electrode DE through the contact hole CH formed through the second insulating layer INS2.

The sacrificial layer SRC is formed on the substrate 110. The sacrificial layer SRC extends in the second direction X2 as shown in FIG. 9D. The sacrificial layer SRC is formed to overlap with the pixel areas PA arranged in the second direction X2. The sacrificial layer SRC is formed in the pixel area PA and the first non-pixel area NPA1 between the pixel areas PA in the second direction X2.

The sacrificial layer SRC is formed by a photoresist process. For example, the sacrificial layer SRC is formed using a negative photoresist. The sacrificial layer SRC is formed on the second insulating layer INS2, the third insulating layer INS3, and the first electrode E1. The sacrificial layer SRC is formed to cover the substrate 110.

Then, a photo-mask, through which portions corresponding to the pixel area PA and the first non-pixel area NPA1 between the pixel areas PA in the second direction X2 are opened, is disposed above the sacrificial layer SRC. The opened portions of the photo-mask disposed above the sacrificial layer SRC extend in the second direction X2.

Portions of the sacrificial layer SRC, which are exposed through the opened portions of the photo-mask, are exposed to light. Since the photoresist is the negative type, the exposed portions of the sacrificial layer SRC remain after a development process is performed on the sacrificial layer SRC and portions of the sacrificial layer SRC, which are not exposed, are removed. Therefore, the sacrificial layer SRC extending in the second direction X2 is formed as shown in FIGS. 9A, 9C, and 9D.

Figure 10A:
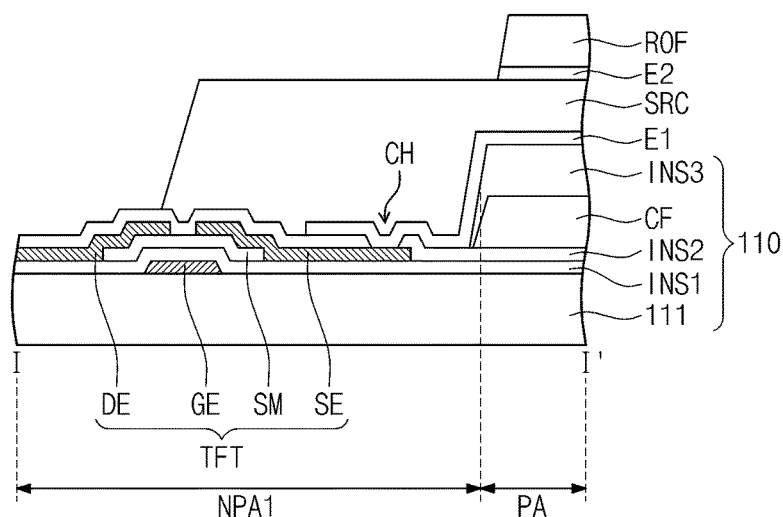
FIGS. 10A, 10B, and 10C are views showing a second electrode and a roof layer, which are disposed on the substrate.
Figure 10B:
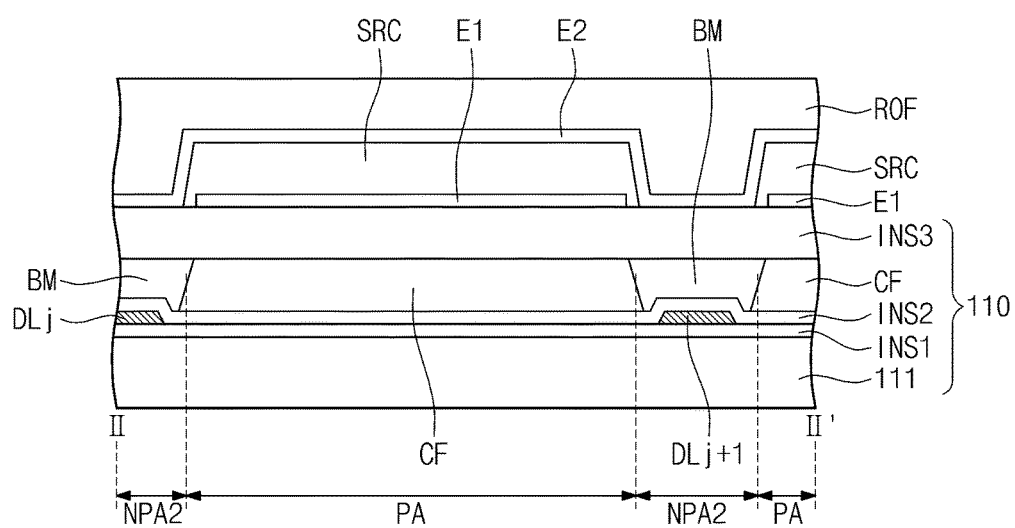
Figure 10C:
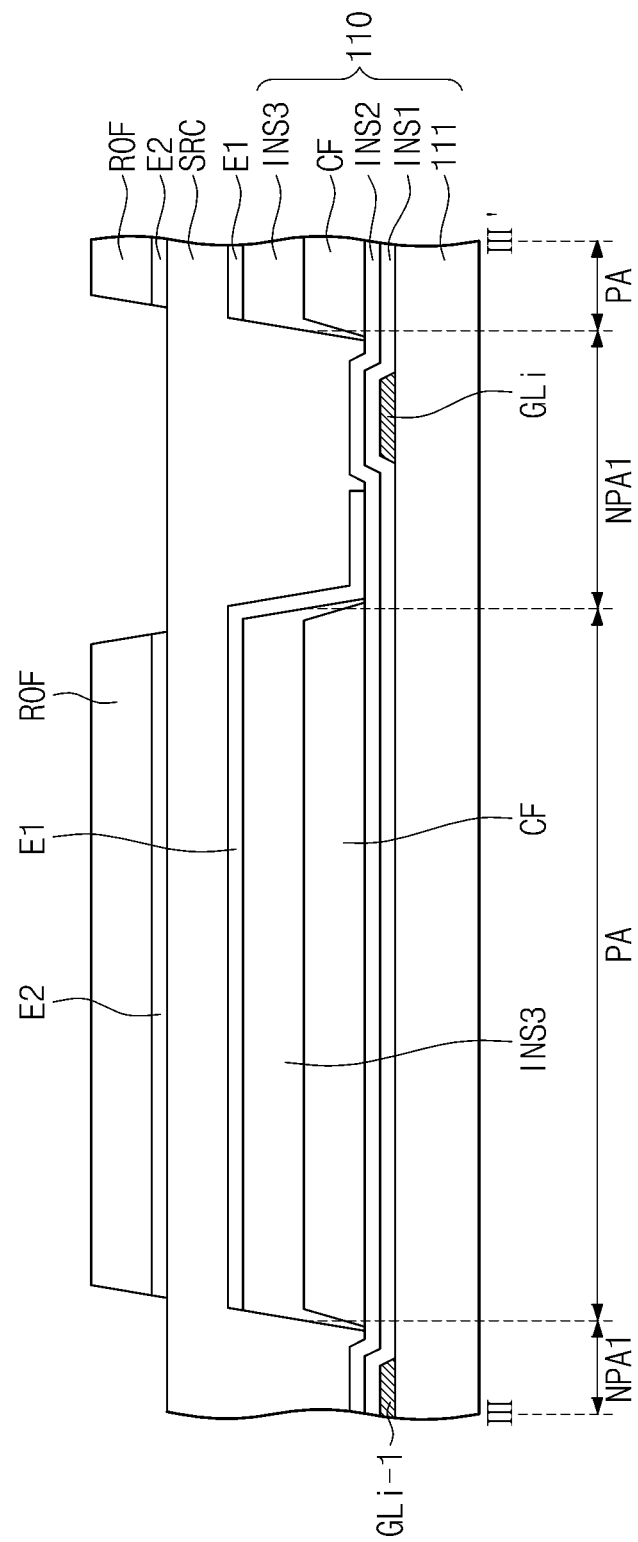

FIGS. 10A, 10B, and 10C are views showing the second electrode and the roof layer, which are disposed on the substrate.

Referring to FIGS. 10A, 10B, and 10C, the second electrode E2 is formed and extends in the first direction X1. The second electrode E2 is formed on the sacrificial layer SRC and the third insulating layer INS3 in the pixel area PA and the second non-pixel area NPA2. The second electrode E2 extends in the first direction X1 and is formed to cover the sacrificial layer SRC in the pixel area PA.

Thus, the second electrode E2 is formed to overlap with the pixel area PA and the second non-pixel area NPA2. In addition, the second electrode E2 is overlapped with the first electrode E1 in the pixel area PA.

Although not shown in figures, the second electrode E2 is formed by forming a conductive layer on the sacrificial layer SRC, forming a photoresist pattern having the same shape as that of the second electrode E2 on the conductive layer, and etching the conductive layer using the photoresist pattern as a mask. The conductive layer includes a transparent conductive material, such as, for example, indium tin oxide, indium zinc oxide, indium tin zinc oxide, or the like. The photoresist pattern is removed after the second electrode E2 is formed.

The roof layer ROF is formed on the substrate 110. The roof layer ROF extends in the first direction X1 to cover the upper surface of the second electrode E2. The roof layer ROF has a planarized upper surface. Accordingly, the second electrode E2 and the roof layer ROF are overlapped with each other and have the same shape when viewed in a plan view. The upper surface of the sacrificial layer SRC is exposed in the area in which the second electrode SE and the roof layer ROF are not formed.

Figure 11A:
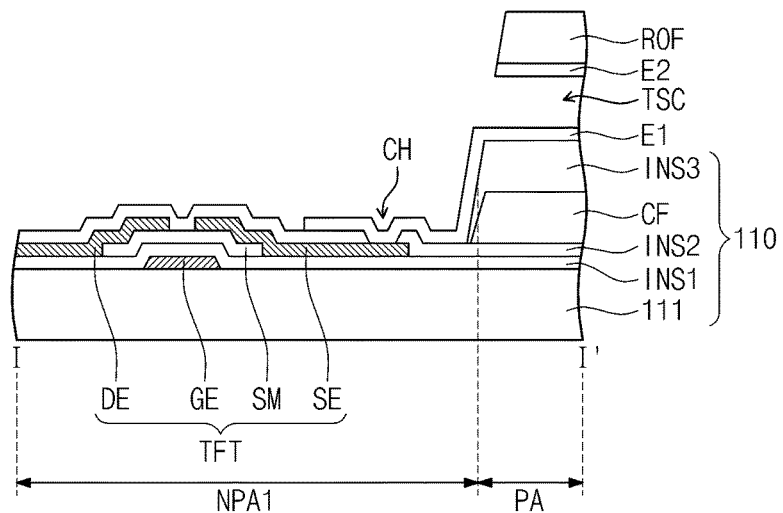
FIGS. 11A, 11B, and 11C are views showing a tunnel-shaped cavity.
Figure 11B:
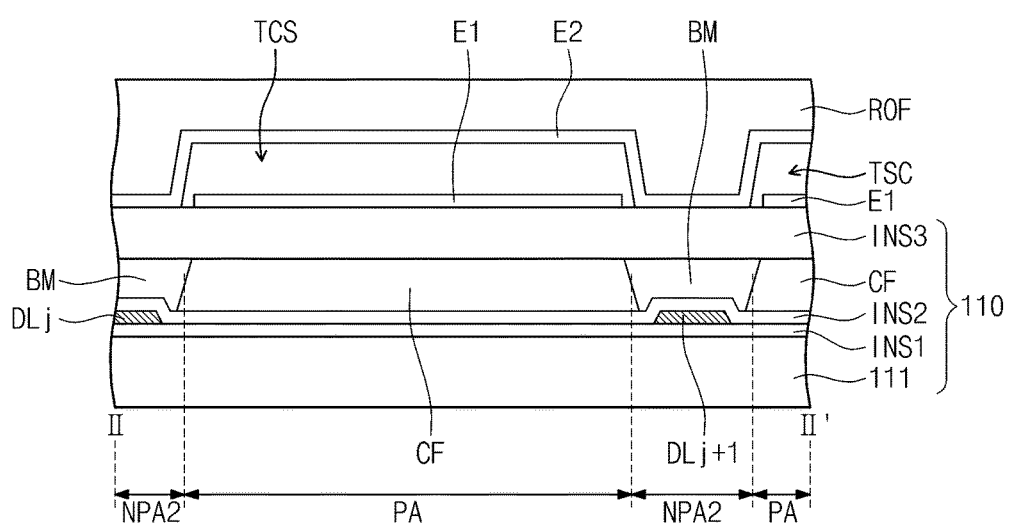
Figure 11C:
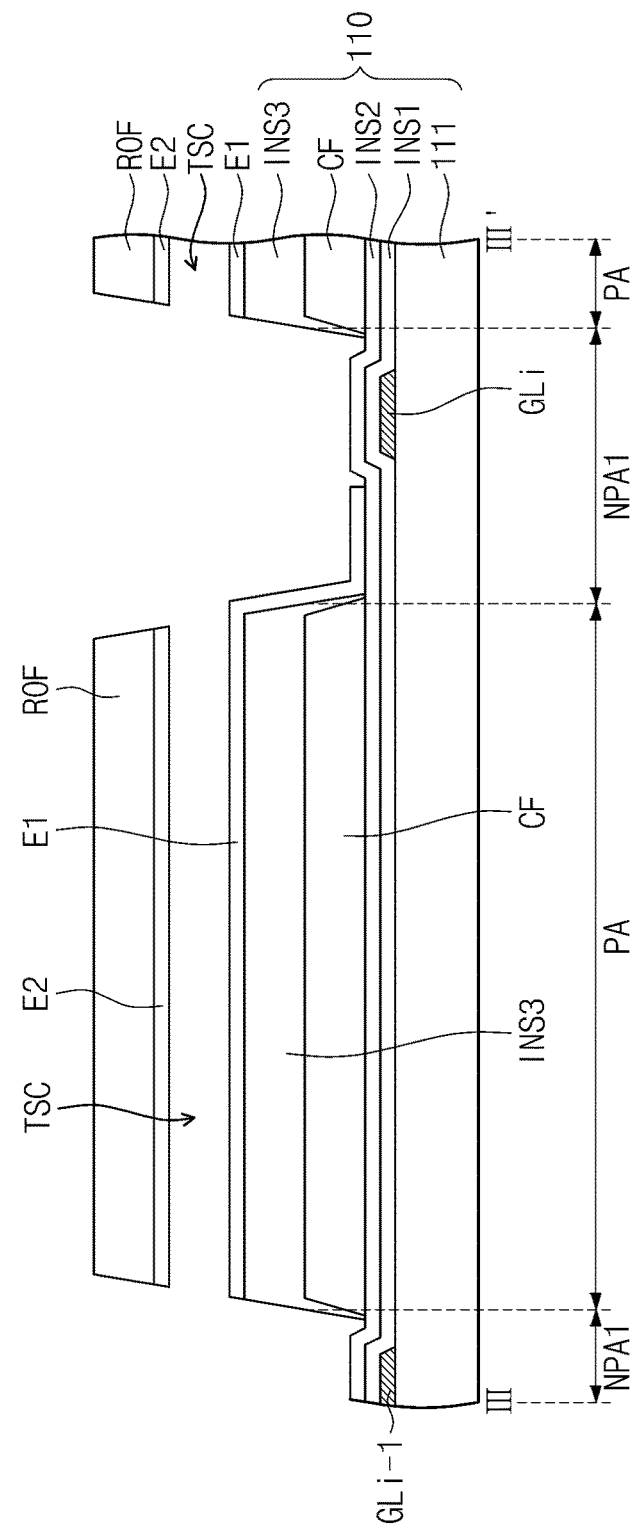

FIGS. 11A, 11B, and 11C are views showing the tunnel-shaped cavity.

Referring to FIGS. 11A, 11B, and 11C, the sacrificial layer SRC is removed by the wet etching process, and thus the tunnel-shaped cavity TSC is formed. The sacrificial layer SRC starts to be etched from the exposed upper surface thereof. Therefore, after the sacrificial layer SRC is removed, the tunnel-shaped cavity TSC has the shape extending in the second direction X2 and both ends of the tunnel-shaped cavity TSC are open.

Figure 12A:
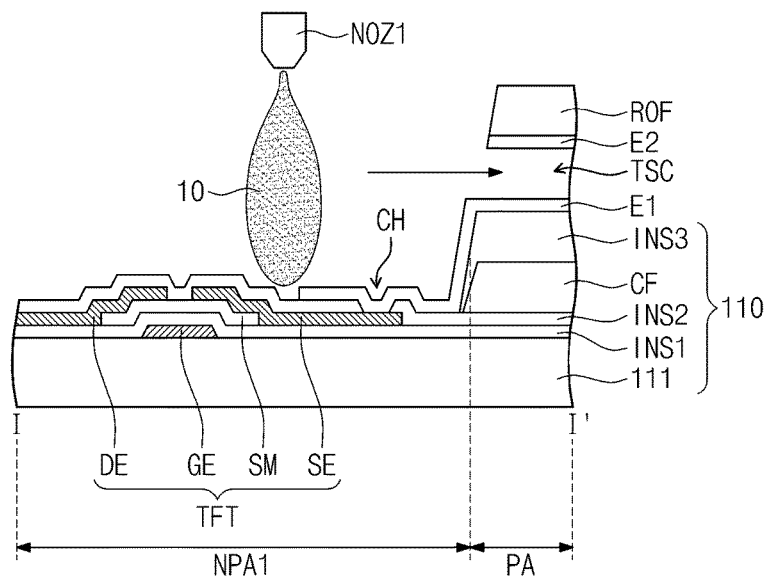
FIGS. 12A, 12B, and 12C are views showing a method of forming a liquid crystal layer in the tunnel-shaped cavity.
Figure 12B:
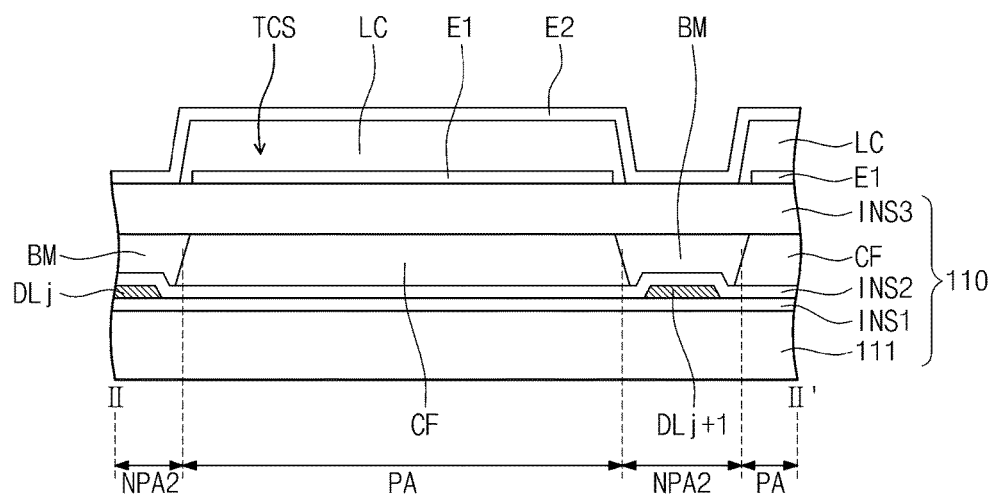
Figure 12C:
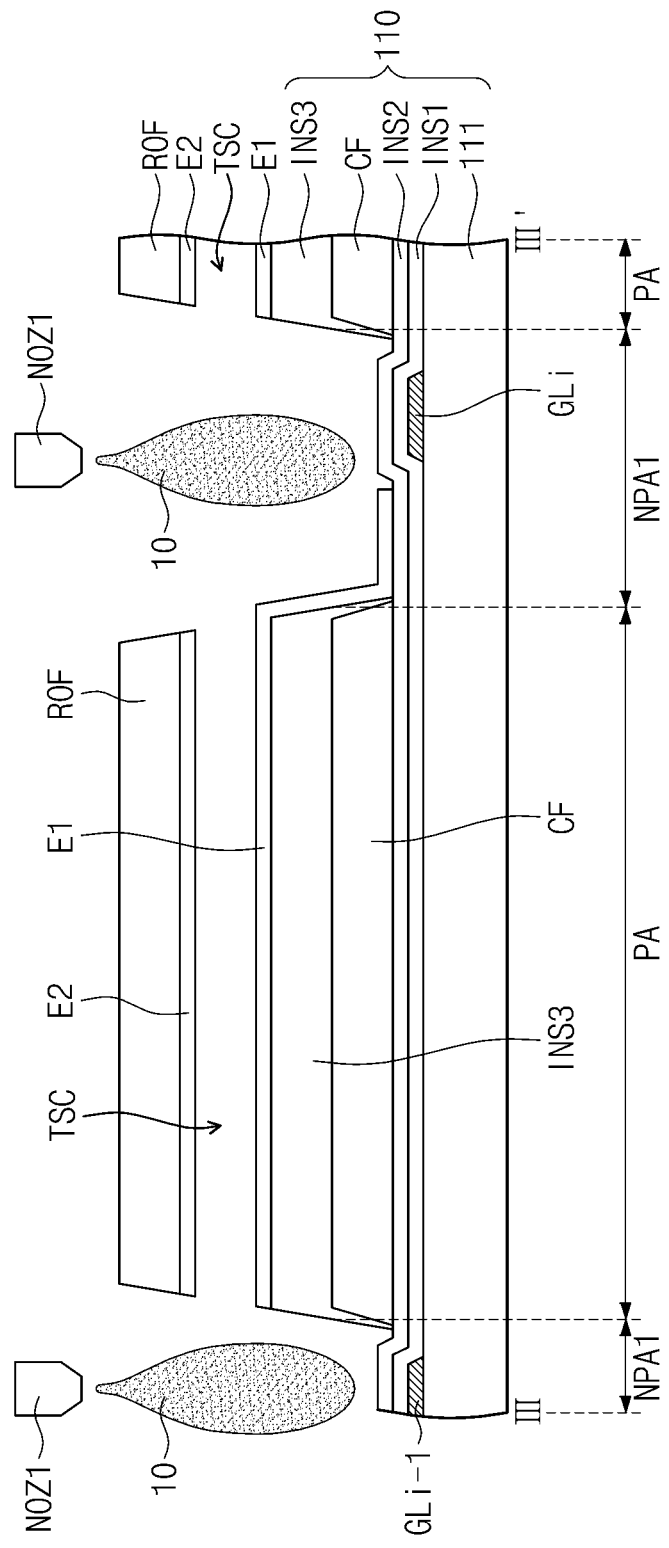

FIGS. 12A, 12B, and 12C are views showing a method of forming the liquid crystal layer in the tunnel-shaped cavity.

Referring to FIGS. 12A, 12B, and 12C, a liquid crystal 10 in fluid state is provided to the first non-pixel area NPA1 through a first nozzle NOZ1 to form the liquid crystal layer LC. The liquid crystal 10 is provided in an area adjacent to the tunnel-shaped cavity TSC. The liquid crystal 10 in fluid state flows into the tunnel-shaped cavity TSC by a capillary phenomenon. Therefore, the liquid crystal layer LC is formed in the tunnel-shaped cavity TSC.

After the liquid crystal layer LC is formed in the tunnel-shaped cavity TSC, the liquid crystal that remains in the first non-pixel area NPA1 is removed by an aqueous solution. For instance, the first non-pixel area NPA1 has a recess shape (or a trench shape) having a height smaller than that of the tunnel-shaped cavity TSC and extending in the first direction X1. The aqueous solution is provided to the first non-pixel area NPA1 having the recess shape extending in the first direction X1 to remove the liquid crystal 10 that remains in the first non-pixel area NPA1.

Figure 13A:
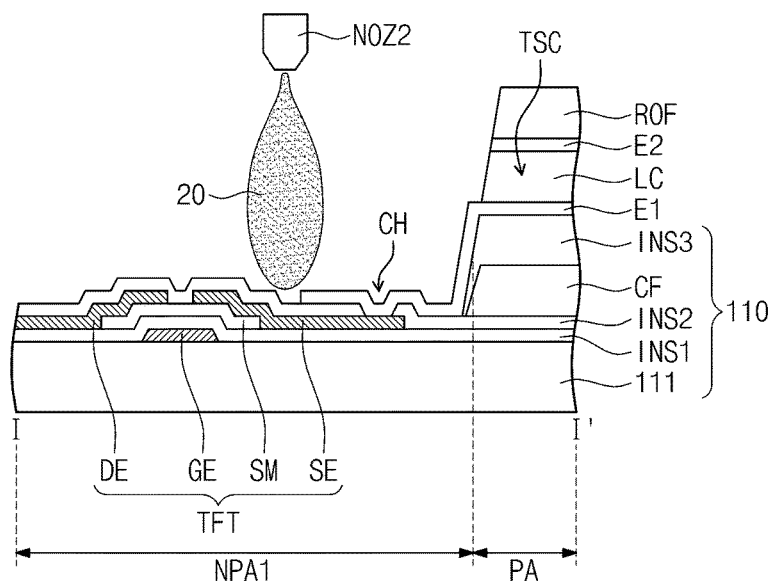
FIGS. 13A, 13B, and 13C are views showing a method of forming a sealing layer in the first non-display area.
Figure 13B:
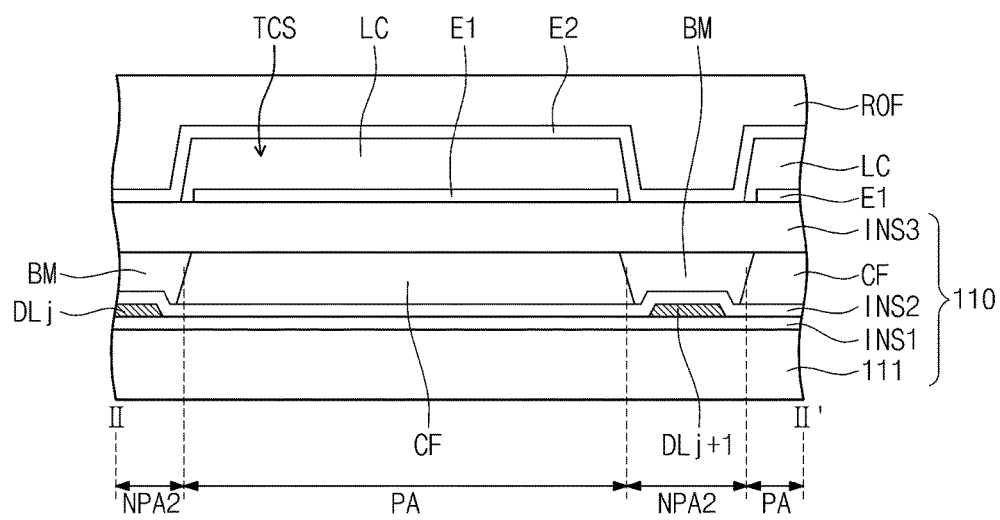
Figure 13C:
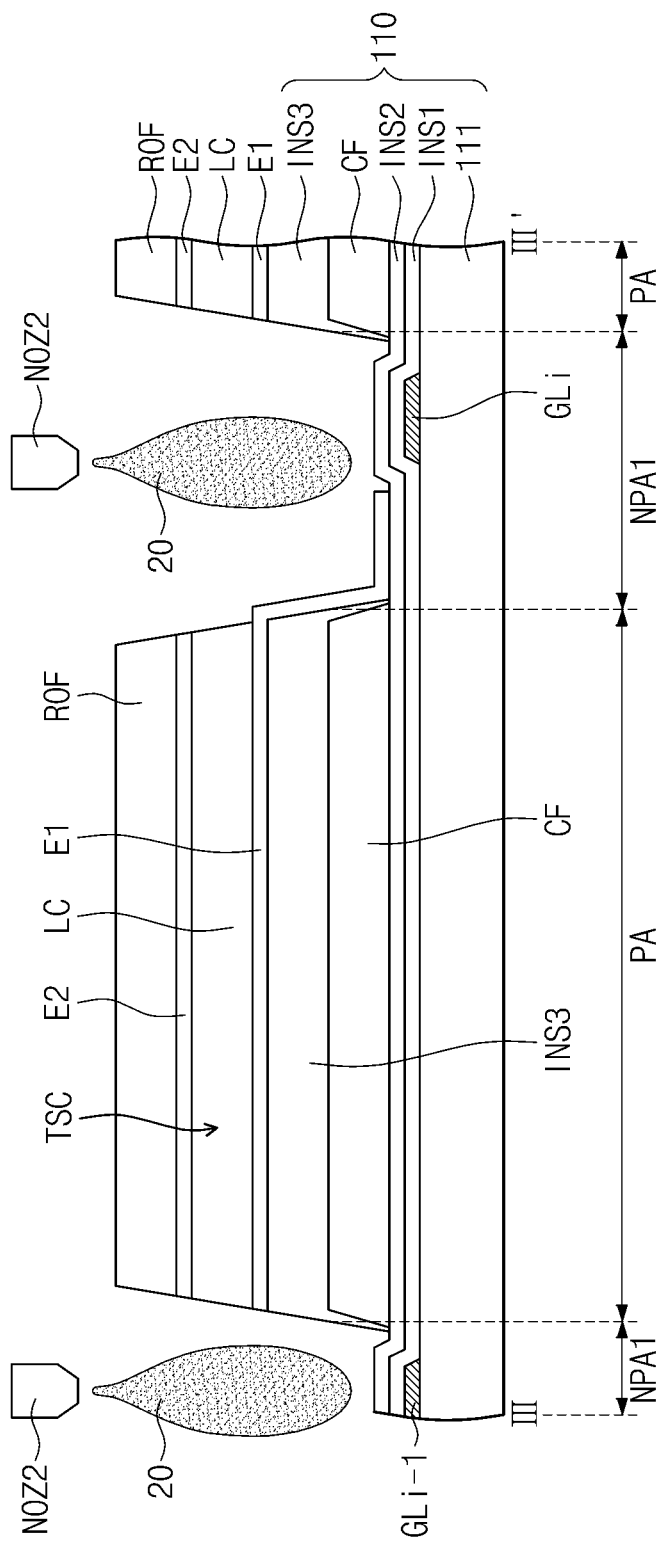

FIGS. 13A, 13B, and 13C are views showing a method of forming the sealing layer in the first non-display area.

Referring to FIGS. 13A, 13B, and 13C, a sealant 20 is provided through a second nozzle NOZ2 in order to form the sealing layer SL on the base substrate 111 in the first non-pixel area NPA1.

The sealing layer SL is provided to have a height equal to the roof layer ROF. As an example, the sealant 20 may be provided to the first non-pixel area NPA1 using an inkjet printing or nozzle printing process.

Figure 14A:
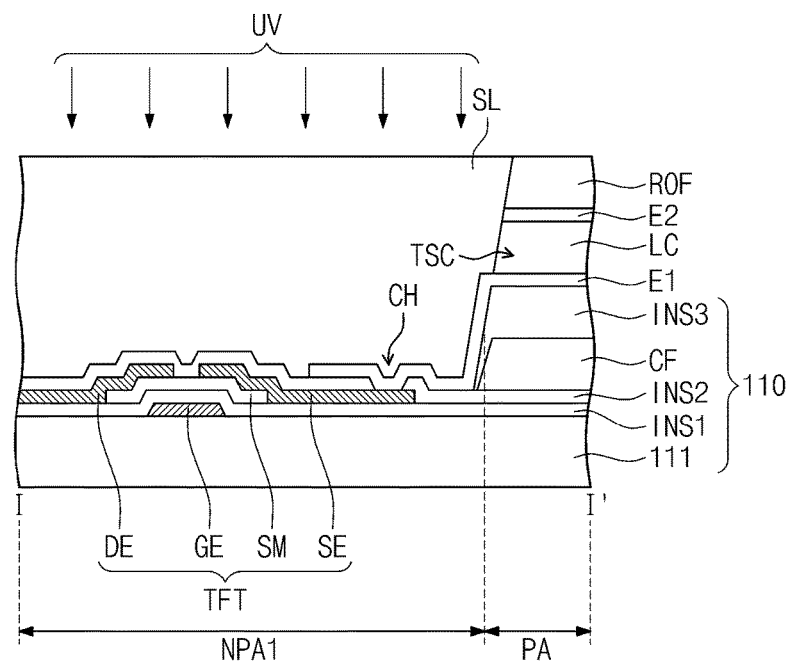
FIGS. 14A, 14B, and 14C are views showing the sealing layer in the first non-display area.
Figure 14B:
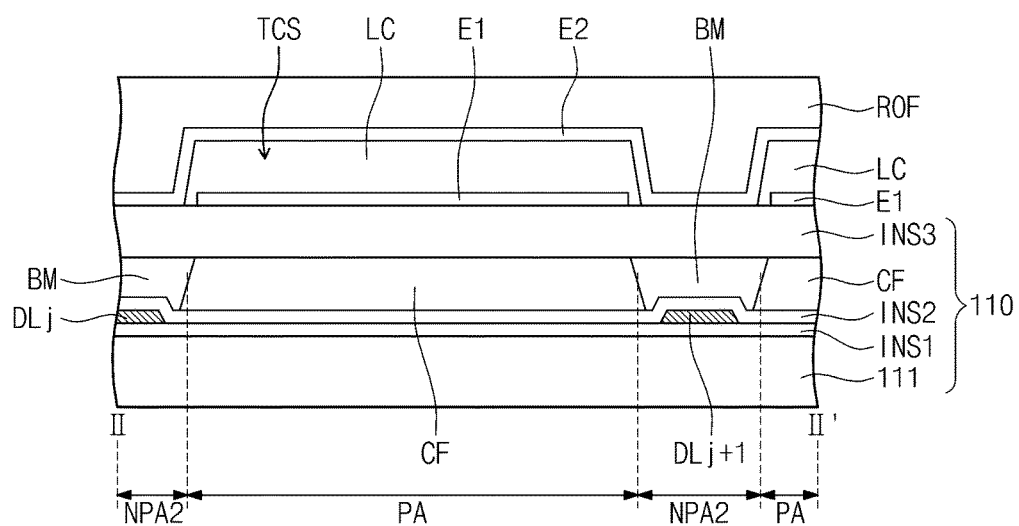
Figure 14C:
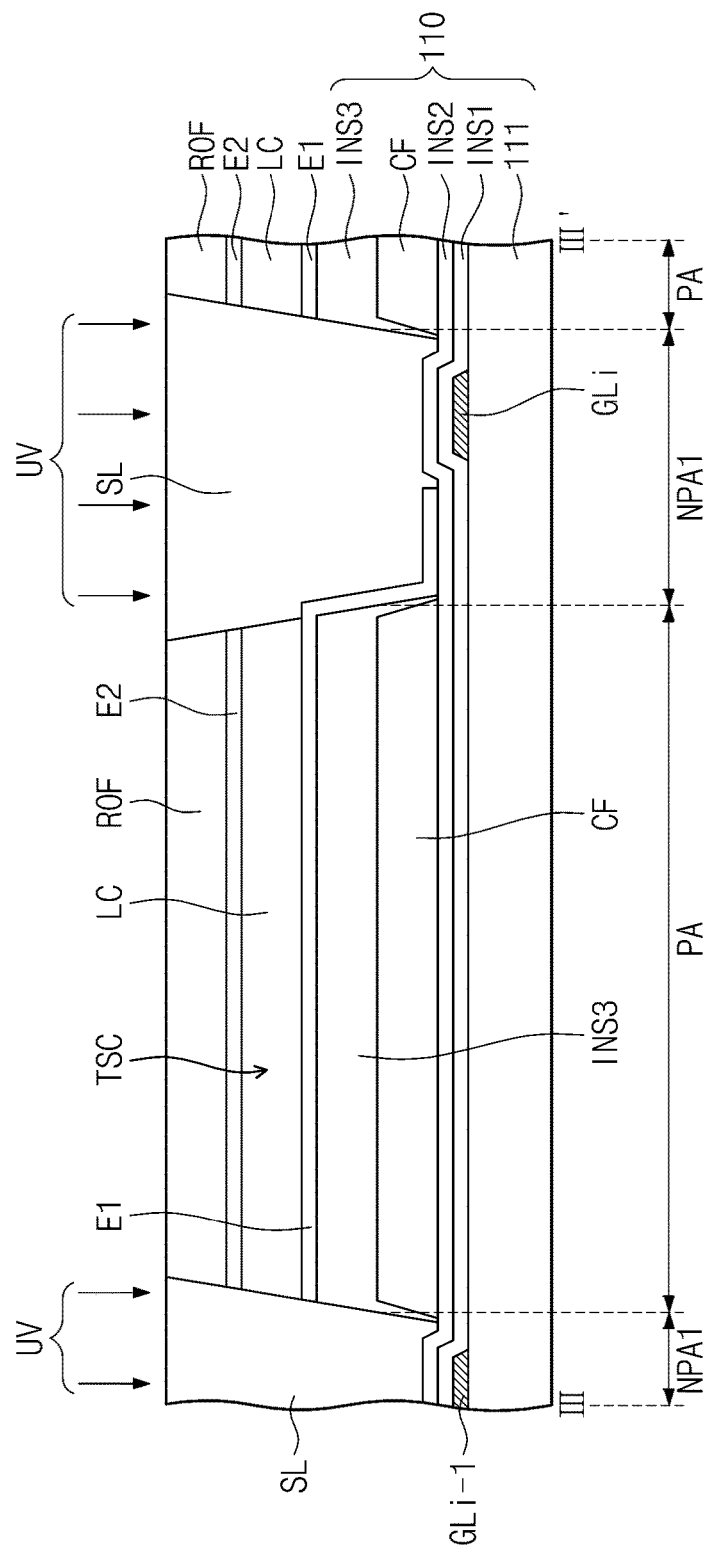

FIGS. 14A, 14B, and 14C are views showing the sealing layer in the first non-display area.

Referring to FIGS. 14A, 14B, and 14C, the sealant 20 is cured by an ultraviolet ray UV. The sealing layer SL is formed on the base substrate 111 in the first non-pixel area NPA1 by the sealant 20 cured by the ultraviolet ray UV. Accordingly, the sealing layer SL formed in the first non-pixel area NPA1 blocks both ends of the tunnel-shaped cavity TSC to seal the tunnel-shaped cavity TSC.

As described above, when the third insulating layer INS3 is formed in the first non-pixel area NPA1, the second black matrix is formed on the third insulating layer INS3 in the first non-pixel area NPA1 to have the height smaller than the tunnel-shaped cavity TSC. The liquid crystal 10 is injected into the tunnel-shaped cavity TSC after the second black matrix is formed on the third insulating layer INS3.

Inlets of the tunnel-shaped cavity TSC may become narrow by the second black matrix. In addition, as the amount of the second black matrix increases, the inlets of the tunnel-shaped cavity TSC become narrower, or are blocked.

When the inlets of the tunnel-shaped cavity TSC become narrower or are blocked, the liquid crystal 10 is not injected as needed into the tunnel-shaped cavity TSC. As a result, the image is not displayed as needed and the reliability of the display apparatus is lowered.

However, according to embodiments of the manufacturing method of the display apparatus 500, both ends of the tunnel-shaped cavity TSC are blocked by the sealing layer SL after the liquid crystal LC is injected into the tunnel-shaped cavity TSC. Therefore, the liquid crystal 10 is injected as needed into the tunnel-shaped cavity TSC, and thus the image is displayed normally. Thus, the reliability of the display apparatus 500 is improved.

In general, the black matrix is formed by a photoresist process. The photoresist with a black color is provided on the substrate, and the photoresist is exposed and developed, thereby forming the black matrix in desired areas. To expose the photoresist to light, a high-priced photo-mask is typically used.

Accordingly, when the second black matrix is used, the photoresist process is performed two times in order to form the first and second black matrices. Two high-priced photo-masks are required to perform the photoresist process. In addition, after the second black matrix is disposed in the first non-pixel area NPA1, a process of forming the sealing layer having light transmittance is performed to additionally seal the tunnel-shaped cavity TSC.

However, according to embodiments of the manufacturing method of the display apparatus 500, the sealing layer SL having a black color is formed in the first non-pixel area NPA1 using the inkjet printing or nozzle printing process, which is typically cheaper than the photoresist process, without using the second black matrix. Therefore, the manufacturing cost of the display apparatus 500 is reduced.

In addition, the sealing layer SL having a black color is formed in the first non-pixel area NPA1 without performing two processes of forming the second black matrix and the sealing layer having light transmittance. The sealing layer SL that blocks both ends of the tunnel-shaped cavity TSC and prevents the occurrence of light leakage may be formed through one process. Thus, the manufacturing process is simplified.

Consequently, the reliability of the display apparatus 500 is improved, the manufacturing cost of the display apparatus 500 is reduced, and the manufacturing process of the display apparatus 500 is simplified.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A display apparatus comprising:
   a plurality of pixels, each pixel defining a pixel area and a non-pixel area surrounding the pixel area, wherein the non-pixel area comprises:
      a first non-pixel area extending in a first direction and disposed between adjacent pixel areas in a second direction crossing the first direction; and
      a second non-pixel area disposed between adjacent pixel areas in the first direction,
   each pixel comprising:
      a substrate comprising a black matrix disposed in the second non-pixel area;
      a first electrode disposed on the substrate in the pixel area;
      a second electrode extending in the first direction to be disposed in the pixel area and the second non-pixel area, and being spaced apart upward from the substrate by a predetermined distance in the pixel area, such that a tunnel-shaped cavity is defined between the second electrode and the substrate;
      an image display layer disposed in the tunnel-shaped cavity and driven by an electric field formed between the first electrode and the second electrode;
      a roof layer disposed on the second electrode; and
      a sealing layer having a black color, and being disposed in the first non-pixel area to seal the tunnel-shaped cavity,
      wherein the black matrix and the sealing layer are formed with different materials from one another.

2. The display apparatus of claim 1, wherein the second electrode is disposed adjacent to the substrate in the second non-pixel area, is not disposed adjacent to the substrate in the pixel area, and is spaced apart upward from the substrate in the pixel areas to define the tunnel-shaped cavity.

3. The display apparatus of claim 1, wherein the substrate further comprises:
   a base substrate;
   a color filter disposed on the base substrate in the pixel area; and
   an organic insulating layer disposed on the color filter and the black matrix.

4. The display apparatus of claim 3, wherein the sealing layer is disposed on the base substrate in the first non-pixel area and has a same height as the roof layer.

5. The display apparatus of claim 3, wherein the black matrix comprises a photoresist resin and at least one of a chromium-containing metal material having a black color or a carbon-containing organic material having a black color.

6. The display apparatus of claim 1, wherein the sealing layer comprises at least one of an acryl resin, an ultra-violet curing agent, a photo initiator, a coupling agent, or carbon-containing particles having a black color.

7. The display apparatus of claim 1, wherein the roof layer is configured to planarize an upper portion of the second electrode.

8. The display apparatus of claim 1, wherein the substrate further comprises a thin film transistor connected to the first electrode and the thin film transistor is disposed in the first non-pixel area.

9. The display apparatus of claim 1, wherein the image display layer comprises a liquid crystal layer.

10. A method of manufacturing the display apparatus of claim 1, comprising:
    forming the plurality of pixels, wherein forming the plurality of pixels comprises:
       preparing the substrate including the pixel area and the non-pixel area disposed between the pixel areas;
       forming the first electrode on the substrate in the pixel area;
       forming a sacrificial layer on the substrate, the sacrificial layer extending in the second direction crossing the first direction and being overlapped with the pixel areas arranged in the second direction;
       forming the second electrode on the substrate, the second electrode extending in the first direction and covering the sacrificial layer in the pixel area;
       forming the roof layer on the second electrode;
       wet-etching the sacrificial layer to form the tunnel-shaped cavity between the second electrode and the substrate in the pixel area;
       forming a liquid crystal layer in the tunnel-shaped cavity; and
       forming the sealing layer extending in the first direction and being disposed in the non-pixel area between the pixel areas in the second direction to seal the tunnel-shaped cavity, the sealing layer having the black color.

11. The method of claim 10, wherein the non-pixel area comprises:
a first non-pixel area disposed between the pixel areas in the second direction and extending in the first direction; and
a second non-pixel area disposed between the pixel areas in the first direction.

12. The method of claim 11, wherein preparing the substrate comprises:
preparing a base substrate;
forming a color filter and a black matrix on the base substrate in the pixel area and the second non-pixel area;
forming an organic insulating layer on the base substrate to cover the color filter and the black matrix; and
removing the organic insulating layer in the first non-pixel area, and wherein the sealing layer is disposed on the base substrate in the first non-pixel area.

13. The method of claim 12, wherein the black matrix comprises a photoresist resin and at least one of a chromium-containing metal material having a black color or a carbon-containing organic material having a black color.

14. The method of claim 12, wherein forming the sealing layer comprises:
providing a sealant on the base substrate in the first non-pixel area; and
curing the sealant using an ultraviolet ray to form the sealing layer, wherein the sealant is provided to the first non-pixel area using at least one of an inkjet printing or nozzle printing process.

15. The method of claim 14, wherein the sealant is formed to a height of the roof layer.

16. The method of claim 14, wherein the sealing layer comprises at least one of an acryl resin, an ultra-violet curing agent, a photo initiator, a coupling agent, or carbon-containing particles having a black color.

17. The method of claim 12, wherein preparing the substrate further comprises forming a thin film transistor on the base substrate to be connected to the first electrode, wherein the thin film transistor is formed in the first non-pixel area.

18. The method of claim 11, wherein forming the liquid crystal layer comprises:
providing a liquid crystal in fluid state to the first non-pixel area such that the liquid crystal flows into the tunnel-shaped cavity by a capillary phenomenon; and
removing the liquid crystal that remains in the first non-pixel area, wherein the liquid crystal layer is formed by the liquid crystal provided in the tunnel-shaped cavity.

19. The method of claim 10, wherein the roof layer is configured to planarize an upper portion of the second electrode.

* * * * *